US009935467B2

(12) United States Patent
Deng

(10) Patent No.: US 9,935,467 B2
(45) Date of Patent: Apr. 3, 2018

(54) POWER SUPPLY SYSTEM, ELECTRONIC DEVICE, AND ELECTRICITY DISTRIBUTION METHOD OF ELECTRONIC DEVICE

(71) Applicant: Huawei Technologies Co., Ltd., Shenzhen (CN)

(72) Inventor: Zhiji Deng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 316 days.

(21) Appl. No.: 14/812,491

(22) Filed: Jul. 29, 2015

(65) Prior Publication Data

US 2015/0333526 A1 Nov. 19, 2015

Related U.S. Application Data

(63) Continuation of application No. PCT/CN2013/087412, filed on Nov. 19, 2013.

(30) Foreign Application Priority Data

Jan. 30, 2013 (CN) .......................... 2013 1 0036198

(51) Int. Cl.
*H02J 1/04* (2006.01)
*H02J 4/00* (2006.01)
(Continued)

(52) U.S. Cl.
CPC .............. *H02J 4/00* (2013.01); *G01R 21/133* (2013.01); *G06F 1/266* (2013.01); *G06F 1/3206* (2013.01);
(Continued)

(58) Field of Classification Search
CPC ........ H04L 12/10; Y10T 307/438; H02J 4/00; H02J 1/06; G06F 1/266; G06F 1/3206; G01R 21/133
See application file for complete search history.

(56) References Cited

U.S. PATENT DOCUMENTS 6,105,142 A * 8/2000 Goff ...................... G06F 1/3203
713/320
6,400,045 B1 * 6/2002 Hosokawa ................ G06F 1/20
307/117

(Continued)

FOREIGN PATENT DOCUMENTS

| CN | 1286446 A | 3/2001 |
|---|---|---|
| CN | 1908844 A | 2/2007 |

(Continued)

OTHER PUBLICATIONS

Foreign Communication From a Counterpart Application, European Application No. 13874062.6, Extended European Search Report dated Feb. 22, 2016, 7 pages.

(Continued)

*Primary Examiner* — Jared Fureman
*Assistant Examiner* — Esayas Yeshaw
(74) *Attorney, Agent, or Firm* — Slater Matsil, LLP

(57) ABSTRACT

A power supply system, an electronic device and an electricity distribution method, which can enhance, with maximum efficiency, power distribution of the electronic device. The power supply system includes a power source unit, an electricity distribution unit connected to the power source unit, a system load power supply unit connected to the electricity distribution unit, and a peripheral power supply unit connected to the electricity distribution unit. The electricity distribution unit includes a power consumption prediction module configured to detect system load power consumption and calculate a variation trend of the system (Continued)

load power consumption and a power consumption control module configured to adjust power supply capacities of the system load power supply unit and the peripheral power supply unit according to the variation trend of the system load power consumption.

20 Claims, 4 Drawing Sheets

(51) Int. Cl.
*G01R 21/133* (2006.01)
*H04L 12/10* (2006.01)
*G06F 1/26* (2006.01)
*G06F 1/32* (2006.01)
*H02J 1/06* (2006.01)

(52) U.S. Cl.
CPC ............... *H02J 1/06* (2013.01); *H04L 12/10* (2013.01); *Y10T 307/438* (2015.04)

(56) References Cited

U.S. PATENT DOCUMENTS

| | | | |
|---|---|---|---|
| 6,636,976 | B1 | 10/2003 | Grochowski et al. |
| 7,023,111 | B2 | 4/2006 | Wieck |
| 7,689,851 | B2* | 3/2010 | Sawyers ............... G06F 1/3203 713/320 |
| 9,454,200 | B2* | 9/2016 | Chadha ................. G06F 1/3206 |
| 2003/0120958 | A1 | 6/2003 | Zhang et al. |
| 2006/0175903 | A1* | 8/2006 | Palmer .................... G06F 1/266 307/39 |
| 2006/0208668 | A1* | 9/2006 | Shimizu ............. H05B 41/2856 315/309 |
| 2008/0103609 | A1 | 5/2008 | Smith |
| 2008/0191675 | A1 | 8/2008 | Besser et al. |
| 2009/0271642 | A1* | 10/2009 | Cheng ..................... G06F 1/263 713/300 |
| 2010/0199112 | A1 | 8/2010 | Yokota et al. |
| 2010/0281281 | A1* | 11/2010 | Humphrey ............ G06F 1/3203 713/323 |
| 2010/0318234 | A1* | 12/2010 | Moore .................. H02J 7/0013 700/293 |
| 2011/0055597 | A1 | 3/2011 | Wyatt |
| 2012/0021704 | A1* | 1/2012 | Chan .................... H03G 3/3042 455/95 |
| 2012/0072741 | A1* | 3/2012 | Lee ......................... G06F 1/266 713/300 |
| 2012/0161516 | A1* | 6/2012 | Koshin ..................... H02J 1/10 307/23 |
| 2012/0216055 | A1* | 8/2012 | Dumas ...................... G06F 1/26 713/320 |

FOREIGN PATENT DOCUMENTS

| | | |
|---|---|---|
| CN | 101102052 A | 1/2008 |
| CN | 101777834 A | 7/2010 |
| CN | 102246049 A | 11/2011 |
| JP | H11316625 A | 11/1999 |
| JP | 2005064379 A | 3/2005 |
| JP | 2006007553 A | 1/2006 |
| JP | 2010176536 A | 8/2010 |
| KR | 20040072681 A | 8/2004 |
| TW | 577990 B | 3/2004 |

OTHER PUBLICATIONS

Partial English Translation and Abstract of Japanese Patent Application No. JPA2006-007553, Sep. 23, 2016, 12 pages.
Partial English Translation and Abstract of Japanese Patent Application No. JPH05-064379, Sep. 23, 2016, 15 pages.
Partial English Translation and Abstract of Japanese Patent Application No. JPH11-316625, Sep. 23, 2016, 32 pages.
Foreign Communication From a Counterpart Application, Japanese Application No. 2015-555553, Japanese Office Action dated Aug. 23, 2016, 3 pages.
Foreign Communication From a Counterpart Application, Japanese Application No. 2015-555553, English Translation of Japanese Office Action dated Aug. 23, 2016, 3 pages.
Foreign Communication From a Counterpart Application, Korean Application No. 10-2015-7022678, Korean Notice of Allowance dated Oct. 31, 2016, 4 pages.
Partial English Translation and Abstract of Chinese Patent Application No. CN102246049, Jul. 27, 2015, 7 pages.
Foreign Communication From a Counterpart Application, PCT Application No. PCT/CN2013/087412, English Translation of International Search Report dated Feb. 20, 2014, 4 pages.
Foreign Communication From a Counterpart Application, PCT Application No. PCT/CN2013/087412, English Translation of Written Opinion dated Feb. 20, 2014, 9 pages.
Partial English Translation and Abstract of Chinese Patent Application No. CN1908844, Apr. 14, 2016, 10 pages.
Partial English Translation and Abstract of Chinese Patent Application No. CN1908844, Apr. 14, 2016, 4 pages.
Foreign Communication From a Counterpart Application, Chinese Application No. 201310036198.4, Chinese Office Action dated Mar. 1, 2016, 7 pages.

* cited by examiner

POWER SUPPLY SYSTEM, ELECTRONIC DEVICE, AND ELECTRICITY DISTRIBUTION METHOD OF ELECTRONIC DEVICE

CROSS-REFERENCE TO RELATED APPLICATIONS

This application is a continuation of International Application No. PCT/CN2013/087412, filed on Nov. 19, 2013, which claims priority to Chinese Patent Application No. 201310036198.4, filed on Jan. 30, 2013, both of which are hereby incorporated by reference in their entireties.

TECHNICAL FIELD

The present invention relates to the field of electricity distribution, and in particular, to a power supply system, an electronic device, and an electricity distribution method of an electronic device.

BACKGROUND

With constant improvement and development of science and technology, an increasing number of electronic devices have entered thousands of families and enriched people's daily life. To satisfy people's demands for multifunctional, multipurpose and extensible devices, many existing electronic devices may connect to external extension devices, which are called peripherals for short. For example, a computer may further include, apart from its main structure, peripherals such as a keyboard, a mouse, and a speaker. Therefore, for an electronic device, not only system load inside the electronic device needs to be powered, but also a possible peripheral needs to be powered.

An electronic device in the prior art generally uses a fixed power supply mode to supply power to a peripheral. For example, when a mobile phone is charged through a universal serial bus (USB) interface of a computer, a power supply mode that may be provided by the computer to the USB interface is that an output voltage is 5 volts (V), and a maximum output current is 0.5 amperes (A). Therefore, the computer may provide the mobile phone with a maximum power of 2.5 watts (W) through the USB interface.

However, a research and development process finds that a disadvantage in the prior art is that system load power consumption of an electronic device may change at any time. Therefore, when the system load power consumption of the electronic device is low, the electronic device cannot distribute remaining power to a peripheral for use because of being restricted by a fixed mode of peripheral power supply, which results in wasteful power consumption. Therefore, the fixed power supply mode in the prior art results in inflexible power distribution of an electronic device, and cannot implement, with maximum efficiency, power distribution of the electronic devices.

SUMMARY

Embodiments of the present invention provide a power supply system, an electronic device, and an electricity distribution method, which can predict a variation trend of system load power consumption, implement redistribution of power supply capacities of a system load power supply unit and a peripheral power supply unit, and enhance, with maximum efficiency, power distribution of an electronic device.

In order to resolve the foregoing technical problem, the embodiments of the present invention use the following technical solutions.

According to a first aspect of the present invention, a power supply system includes a power source unit, an electricity distribution unit connected to the power source unit, a system load power supply unit connected to the electricity distribution unit, and a peripheral power supply unit connected to the electricity distribution unit, where the electricity distribution unit includes a power consumption prediction module configured to detect system load power consumption and calculate a variation trend of the system load power consumption; and a power consumption control module configured to adjust power supply capacities of the system load power supply unit and the peripheral power supply unit according to the variation trend of the system load power consumption.

In a first possible implementation manner, the power consumption prediction module includes a detection circuit configured to detect a system load current and a change rate of the system load current, where the system load current is used to reflect the system load power consumption; a time generation circuit configured to generate a reference time; and a calculation circuit configured to calculate a predicted current that is after the reference time according to the system load current, the change rate of the system load current and the reference time, where the predicted current is used to reflect the variation trend of the system load power consumption; wherein the power consumption control module includes a comparator circuit configured to set a reference current and compare the predicted current with the reference current; and a control circuit configured to, when the predicted current is greater than the reference current, increase the power supply capacity of the system load power supply unit and reduce the power supply capacity of the peripheral power supply unit; and when the predicted current is not greater than the reference current, reduce the power supply capacity of the system load power supply unit and increase the power supply capacity of the peripheral power supply unit.

With reference to the first possible implementation manner of the first aspect, in a second possible implementation manner, the detection circuit includes a first resistor connected between an input end and an output end of the system load power supply unit and configured to collect the system load current; a first operational amplifier having a negative input end connected to the input end of the system load power supply unit through a second resistor, a positive input end connected to the output end of the system load power supply unit through a third resistor, and an output end delivering a first voltage reflecting the system load current; a fourth resistor having one end connected to the negative input end of the first operational amplifier and the other end connected to the output end of the first operational amplifier; a fifth resistor having one end connected to the positive input end of the first operational amplifier and the other end connected to the ground; a second operational amplifier having a positive input end connected to the ground through a sixth resistor, a negative input end connected to the output end of the first operational amplifier through a first capacitor, and an output end delivering a second voltage reflecting the change rate of the system load current; and a seventh resistor having one end connected to the negative input end of the second operational amplifier and the other end connected to the output end of the second operational amplifier.

With reference to the second possible implementation manner of the first aspect, in a third possible implementation manner, the time generation circuit includes a third operational amplifier having a positive input end connected to the output end of the second operational amplifier through an eighth resistor, a negative input end connected to the ground through a ninth resistor, and an output end delivering a third voltage reflecting the reference time; a tenth resistor having one end connected to the positive input end of the third operational amplifier and the other end connected to the ground; and an eleventh resistor having one end connected to the negative input end of the third operational amplifier and the other end connected to the output end of the third operational amplifier.

With reference to the third possible implementation manner of the first aspect, in a fourth possible implementation manner, the calculation circuit includes a fourth operational amplifier having a positive input end that is connected to the output end of the third operational amplifier through a twelfth resistor, is connected to the output end of the first operational amplifier through a thirteenth resistor, and is connected to the ground through a fourteenth resistor; a negative input end connected to the ground through a fifteenth resistor; and an output end delivering a fourth voltage reflecting the predicted current; and a sixteenth resistor having one end connected to the negative input end of the fourth operational amplifier and the other end connected to the output end of the fourth operational amplifier.

With reference to the fourth possible implementation manner of the first aspect, in a fifth possible implementation manner, the comparator circuit includes at least one comparator, and the comparator has a positive input end connected to the ground through a preset power source, a negative input end connected to the output end of the fourth operational amplifier, and an output end delivering a result of the comparison of a reference voltage with the fourth voltage, where the preset power source is configured to provide the reference voltage reflecting the reference current.

According to another aspect of the present invention, an electronic device is provided, and includes the power supply system described above.

According to a third aspect of the present invention, an electricity distribution method of an electronic device is provided, and includes detecting system load power consumption; and calculating a variation trend of the system load power consumption so as to adjust power supply capacities of a system load power supply unit and a peripheral power supply unit according to the variation trend of the system load power consumption.

In a first possible implementation manner, calculating a variation trend of the system load power consumption includes detecting a system load current and a change rate of the system load current; generating a reference time; and calculating a predicted current according to the system load current, the change rate of the system load current and the reference time, where the predicted current is used to reflect the variation trend of the system load power consumption that is after the reference time.

With reference to the first possible implementation manner of the third aspect, in a second possible implementation manner, adjusting power supply capacities of a system load power supply unit and a peripheral power supply unit according to the variation trend of the system load power consumption includes setting a reference current; comparing the predicted current with the reference current; when the predicted current is greater than the reference current, increasing the power supply capacity of the system load power supply unit and reducing the power supply capacity of the peripheral power supply unit; and when the predicted current is not greater than the reference current, reducing the power supply capacity of the system load power supply unit and increasing the power supply capacity of the peripheral power supply unit.

According to a power supply system, an electronic device, and an electricity distribution method provided by the embodiments of the present invention, system load power consumption is detected, a variation trend of the system load power consumption is calculated, and power supply capacities of a system load power supply unit and a peripheral power supply unit are adjusted according to the variation trend of the system load power consumption so as to enhance, with maximum efficiency, a power distribution capability of an electronic device.

BRIEF DESCRIPTION OF DRAWINGS

To describe the technical solutions in the embodiments of the present invention more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DESCRIPTION OF EMBODIMENTS

A power supply system provided by an embodiment of the present invention can predict a variation trend of system load power consumption, implement redistribution of power supply capacities of a system load power supply unit and a peripheral power supply unit, and enhance, with maximum efficiency, power distribution of an electronic device.

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
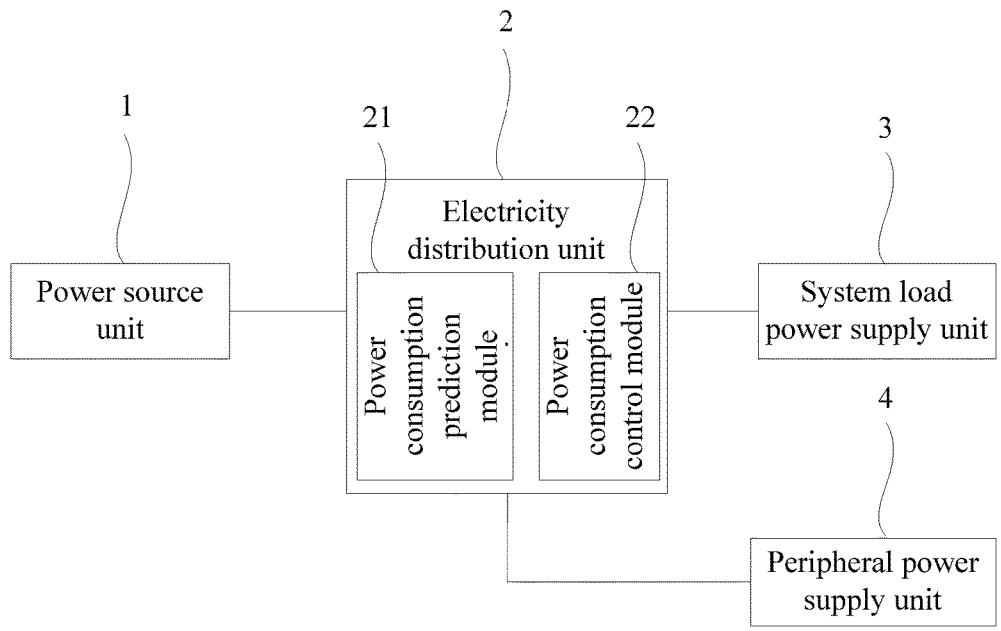
FIG. 1 is a structural block diagram of a power supply system according to an embodiment of the present invention.

According to one aspect of the present invention, a power supply system is provided, and as shown in FIG. 1, includes a power source unit 1, an electricity distribution unit 2 connected to the power source unit 1, a system load power supply unit 3 connected to the electricity distribution unit 2, and a peripheral power supply unit 4 connected to the electricity distribution unit 2. The power source unit 1 is configured to provide total input power to supply power to a system load and a peripheral; and the electricity distribution unit 2 distributes the total input power provided by the power source unit 1, transmits system load power to the system load power supply unit 3, and transmits peripheral power to the peripheral power supply unit 4. The electricity distribution unit 2 includes a power consumption prediction module 21 and a power consumption control module 22. The power consumption prediction module 21 is configured to detect system load power consumption and calculate a variation trend of the system load power consumption; and the power consumption control module 22 adjusts power supply capacities of the system load power supply unit and the peripheral power supply unit according to the variation trend of the system load power consumption.

The total input power provided by the power source unit 1 may be divided into two parts. One part is provided for operation of the system load, and the other part is provided for operation of the peripheral. In fact, working states of the system load and the peripheral are in a state of flux. Therefore, by detecting the system load power consumption and calculating the variation trend of the system load power consumption using the power consumption prediction module 21, power consumption required by the system load and the peripheral may be predicted; then, the power consumption control module 22 adjusts the power supply capacities of the system load power supply unit 3 and the peripheral power supply unit 4, making the entire power supply system reach maximum power supply efficiency. For example, when the system load is idle, the foregoing power supply system reduces the power supply capacity of the system load power supply unit 3, and increases the power supply capacity of the peripheral power supply unit 4 so as to provide remaining energy to the peripheral. For example, a mobile phone is seen as the peripheral and is connected to a computer through a USB interface. In this case, when the computer is in an idle state, remaining power is provided for charging the mobile phone, which enables the mobile phone to make the best use of the power and reduces a time required for charging the mobile phone. When the system load is busy, the foregoing power supply system increases the power supply capacity of the system load power supply unit 3, and reduces the power supply capacity of the peripheral power supply unit 4 so as to preferentially provide the power to the system load to ensure normal operation of the power supply system.

In a power supply system provided by the embodiment of the present invention, system load power consumption is detected, a variation trend of the system load power consumption is calculated, and power supply capacities of a system load power supply unit and a peripheral power supply unit are adjusted according to the variation trend of the system load power consumption so as to enhance, with maximum efficiency, a power distribution capability of an electronic device.

Figure 2:
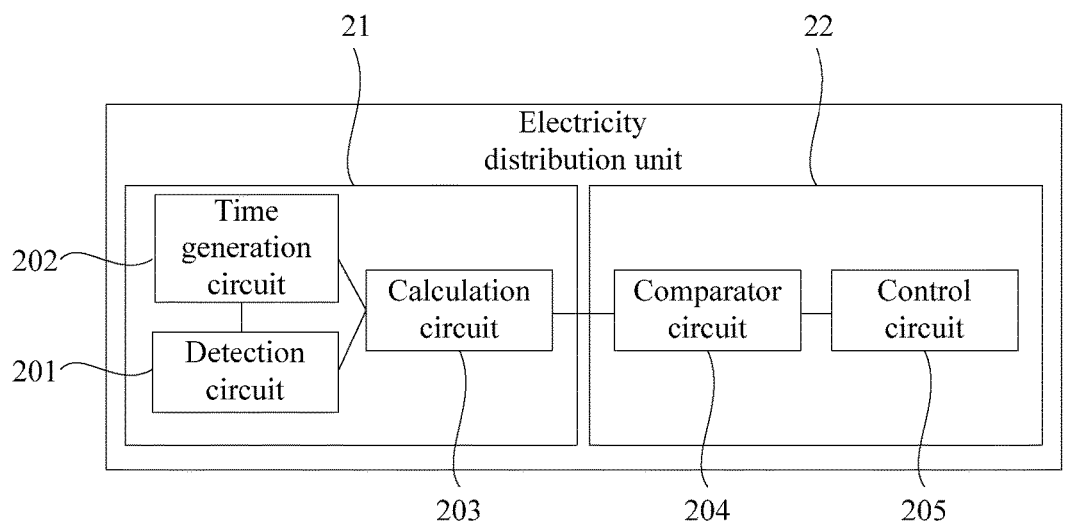
FIG. 2 is a structural block diagram of an electricity distribution unit according to an embodiment of the present invention.

According to an implementation manner of the present invention, as shown in FIG. 2, the power consumption prediction module 21 includes a detection circuit 201, a time generation circuit 202 and a calculation circuit 203; and the power consumption control module 22 includes a comparator circuit 204 and a control circuit 205. The detection circuit 201 is configured to detect a system load current and a change rate of the system load current. It should be noted that, using a system load of a purely resistive circuit as an example, electric power P of the system load meets $P=I^2R$, where I is the system load current, and R is a resistance value corresponding to the system load. Therefore, the system load current may be used to reflect a situation of the system load power consumption. The time generation circuit 202 is configured to generate a reference time, and a required reference time is obtained by adjusting the time generation circuit 202. The calculation circuit 203 calculates a predicted current that is after the reference time according to the system load current, the change rate of the system load current, and the reference time. A calculation formula of the predicted current may be described as follows: the predicted current=the system load current+the change rate of system load current*the reference time. In fact, the predicted current reflects a variation trend of the system load power consumption that is after the reference time. The variation trend of the power consumption includes that, for example, the power consumption becomes larger, the power consumption becomes smaller, or the power consumption does not change. At this point, the power consumption prediction module 21 achieves the purpose of detecting the system load power consumption and calculating the variation trend of the system load power consumption.

The comparator circuit 204 is configured to set a reference current and compare the reference current with the predicted current generated by the calculation circuit 203. It should be noted that the reference current may be set according to precision required to be achieved during power distribution performed by the power supply system. For example, an appropriate current value of the reference current is set so as to accurately predict power consumption situations of the system load and the peripheral; and in addition, at least one reference current may further be set, for example, three reference currents are set. A person skilled in the art may further set another number of reference currents so as to more finely adjust the power supply capacity of the system load and the power supply capacity of the peripheral. The control circuit 205 receives a result of the comparison from the comparator circuit 204 and accomplishes the adjustment of the power supply capacity of the system load and the power supply capacity of the peripheral. In fact, the result of the comparison includes the following two possibilities. When the predicted current is greater than the reference current, it indicates that the system load current has a trend of becoming larger after the reference time, and the system load power consumption has a trend of increasing. Therefore, the control circuit 205 increases the power supply capacity of the system load power supply unit and reduces the power supply capacity of the peripheral power supply unit. On the contrary, when the predicted current is not greater than the reference current, it indicates that the system load current has a trend of becoming smaller after the reference time, and the system load power consumption has a trend of decreasing. Therefore, the control circuit 205 reduces the power supply capacity of the system load power supply unit and increases the power supply capacity of the peripheral power supply unit. At this point, the power consumption control module 22 accomplishes the adjustment of the power supply capacities of the system load power supply unit and the peripheral power supply unit according to the variation trend of the system load power consumption.

Figure 3:
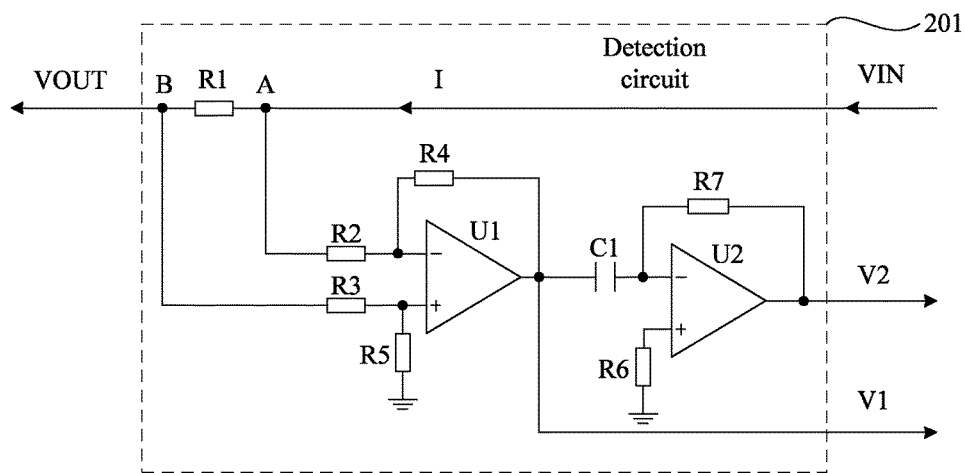
FIG. 3 is a circuit diagram of a detection circuit according to an embodiment of the present invention.

Further, according to an implementation manner of the present invention, as shown in FIG. 3, the detection circuit 201 is configured to detect the system load current and the change rate of the system load current, where the detection circuit 201 includes a plurality of resistors R1, R2, R3, R4, R5, R6, and R7, a first operational amplifier U1, a second operational amplifier U2 and a capacitor C1. The resistor R1 is connected between an input end and an output end of the system load power supply unit, and configured to collect the system load current. In fact, the resistor R1 is a sampling resistor (SR), and is also referred to as a current detecting resistor, a current sensing resistor, or the like, which is connected in a circuit in series and configured to convert a current into a voltage signal to perform measurement. Endpoints at two sides of the resistor R1 are A, B separately, where the endpoint A is connected to an input end (VIN end) of the system load power supply unit, and the endpoint B is connected to an output end (VOUT end) of the system load power supply unit. Therefore, when the system load current is I, a voltage between the endpoints A, B at the two sides of the resistor R1 may reflect the system load current: $V_{AB}=I*R_1$. Then, the resistor R2 is connected in series between a negative input end of the first operational amplifier U1 and the endpoint A, the resistor R3 is connected in series between a positive input end of the first operational amplifier U1 and the endpoint B, the resistor R4 is connected in series between the negative input end of the first operational amplifier U1 and an output end of the first operational amplifier U1, and the resistor R5 is connected in series between the positive input end of the first operational amplifier U1 and a ground terminal. The resistors R2, R3, R4, and R5 and the first operational amplifier U1 form an amplifier circuit. According to an operational formula of the amplifier circuit, a first voltage $V_1$ delivered by the output end of the first operational amplifier U1 is directly proportional to $V_{AB}$. For example, assuming that $R_2=R_3$ and $R_4=R_5$ are simplified, $V_1=(R_4/R_5)*V_{AB}=(R_1*R_4/R_2)*I=k_1*I$, where $R_1$ is a resistance value of the resistor R1, and $k_1$ is a first amplification coefficient. Therefore, the first voltage $V_1$ delivered by the output end of the first operational amplifier U1 is used to reflect the system load current I.

And then, the capacitor C1 is connected in series between the output end of the first operational amplifier U1 and a negative input end of the second operational amplifier U2, the resistor R6 is connected in series between a positive input end of the second operational amplifier U2 and the ground terminal, and the resistor R7 is connected in series between the negative input end of the second operational amplifier U2 and an output end of the second operational amplifier U2. The resistors R6 and R7, the capacitor C1, and the second operational amplifier U2 form a differential amplifier circuit. According to an operational formula of the differential amplifier circuit, a second voltage $V_2$ delivered by the output end of the second operational amplifier U2 is directly proportional to $dV_1/dt$. For example, $V_2=R_7*C_1*(dV_1/dt)=R_7*C_1*k_1*dI/dt=k_2*dI/dt$, where $R_7$ is a resistance value of the resistor R7, $C_1$ is a capacitance of the capacitor C1, and $k_2$ is a second amplification coefficient. Therefore, the second voltage $V_2$ delivered by the output end of the second operational amplifier U2 is used to reflect the change rate $dI/dt$ of the system load current.

Figure 4:
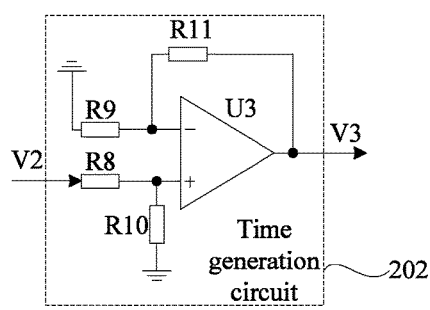
FIG. 4 is a circuit diagram of a time generation circuit according to an embodiment of the present invention.

Further, according to an implementation manner of the present invention, as shown in FIG. 4, the time generation circuit 202 is configured to generate the reference time, where the time generation circuit 202 includes a plurality of resistors R8, R9, R10, and R11 and a third operational amplifier U3. The resistor R8 is connected in series between a positive input end of the third operational amplifier U3 and the output end of the second operational amplifier U2, the resistor R9 is connected in series between a negative input end of the third operational amplifier U3 and the ground terminal, the resistor R10 is connected in series between the positive input end of the third operational amplifier U3 and the ground terminal, and the resistor R11 is connected in series between the negative input end of the third operational amplifier U3 and an output end of the second operational amplifier U3. The resistors R8, R9, R10, and R11 and the third operational amplifier U3 form an amplifier circuit. According to an operational formula of the amplifier circuit, a third voltage $V_3$ delivered by the output end of the third operational amplifier U3 is directly proportional to $V_2$. For example, $V_3=[R_{10}/(R_8+R_{10})]*[(R_9+R_{11})/R_9]*V_2=k_3*V_2$, where $k_3$ is a third amplification coefficient and depends on the resistors R8, R9, R10, and R11. In fact, the third voltage $V_3$ is directly proportional to $V_2$. Herein, the third amplification coefficient $k_3$ is used as the reference time generated by the time generation circuit 202, and a required reference time may be generated by changing the resistors R8, R9, R10, and R11.

Figure 5:
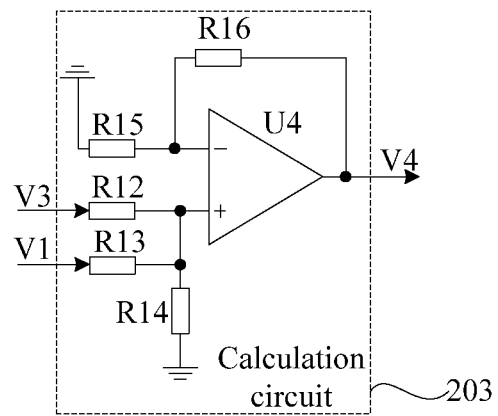
FIG. 5 is a circuit diagram of a calculation circuit according to an embodiment of the present invention.

Further, according to an implementation manner of the present invention, as shown in FIG. 5, the calculation circuit 203 is configured to calculate the predicted current that is after the reference time according to the system load current, the change rate of the system load current, and the reference time, where the calculation circuit 203 includes a plurality of resistors R12, R13, R14, R15, and R16, and a fourth operational amplifier U4. The resistor R12 is connected in series between a positive input end of the fourth operational amplifier U4 and the output end of the third operational amplifier U3, the resistor R13 is connected in series between the positive input end of the fourth operational amplifier U4 and the output end of the first operational amplifier U1, the resistor R14 is connected in series between the positive input end of the fourth operational amplifier U4 and the ground terminal, the resistor R15 is connected in series between a negative input end of the fourth operational amplifier U4 and the ground terminal, and the resistor R16 is connected in series between the negative input end of the fourth operational amplifier U4 and an output end of the fourth operational amplifier U4. The resistors R12, R13, R14, R15, and R16 and the fourth operational amplifier U4 form an amplifier circuit. According to an operational formula of the amplifier circuit, a fourth voltage $V_4$ delivered by the output end of the fourth operational amplifier U4 may be represented as: $V_4=k_4*(V_1+V_3)=k_4*(V_1+k_3*V_2)$, where $V_1$ represents the system load current, $V_2$ represents the change rate of the system load current, $k_3$ is the generated reference time, and $k_4$ is a fourth amplification coefficient. However, the predicted current=the system load current+the change rate of system load current*the reference time. Therefore, the fourth voltage $V_4$ delivered by the output end of the fourth operational amplifier U4 is used to reflect the predicted current of the system load current that is after the reference time.

Figure 6:
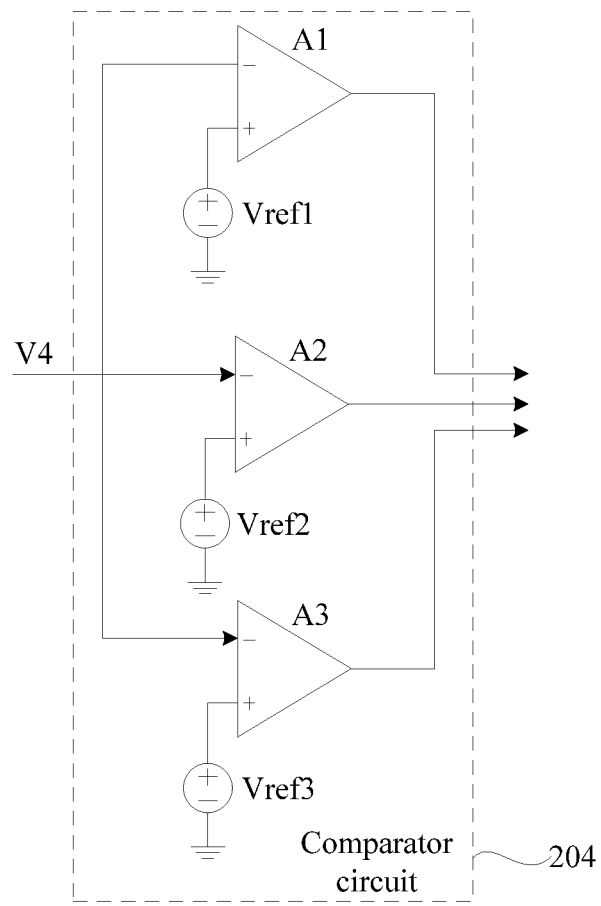
FIG. 6 is a circuit diagram of a comparator circuit according to an embodiment of the present invention.

Further, according to an implementation manner of the present invention, as shown in FIG. 6, the comparator circuit 204 is configured to set the reference current and compare the reference current with the predicted current generated by the calculation circuit 203, where the comparator circuit 204 includes comparators A1, A2, and A3 and preset power sources Vref1, Vref2, and Vref3. Negative input ends of the comparators A1, A2, and A3 are connected to the output end of the fourth operational amplifier U4, a positive input end of the comparator A1 is connected to the ground terminal through the preset power source Vref1, a positive input end of the comparator A2 is connected to the ground terminal through the preset power source Vref2, and a positive input end of the comparator A3 is connected to the ground terminal through the preset power source Vref3. The comparators A1, A2, and A3 receive the fourth voltage (i.e. a predicted voltage) and then deliver a result of the comparison through the output ends, where the result of the comparison reflects the result of the comparison of the reference current with the predicted current. For the delivered result of the comparison, for example, when the predicted voltage is greater than the reference voltage, a comparison result Y is delivered; and otherwise, a comparison result N is delivered.

And then, the control circuit receives the result of the comparison delivered by the comparator circuit and accomplishes the adjustment of the power supply capacity of the system load and the power supply capacity of the peripheral. For example, when the predicted current is greater than the reference current, the control circuit increases the power supply capacity of the system load power supply unit and reduces the power supply capacity of the peripheral power supply unit; when the predicted current is not greater than the reference current, the control circuit reduces the power supply capacity of the system load power supply unit and increases the power supply capacity of the peripheral power supply unit.

To enable a person skilled in the art to better understand the technical solution of a power supply system provided by the embodiment of the present invention, the following describes, using specific embodiments, in detail a work process of the power supply system provided by the present invention.

Figure 7:
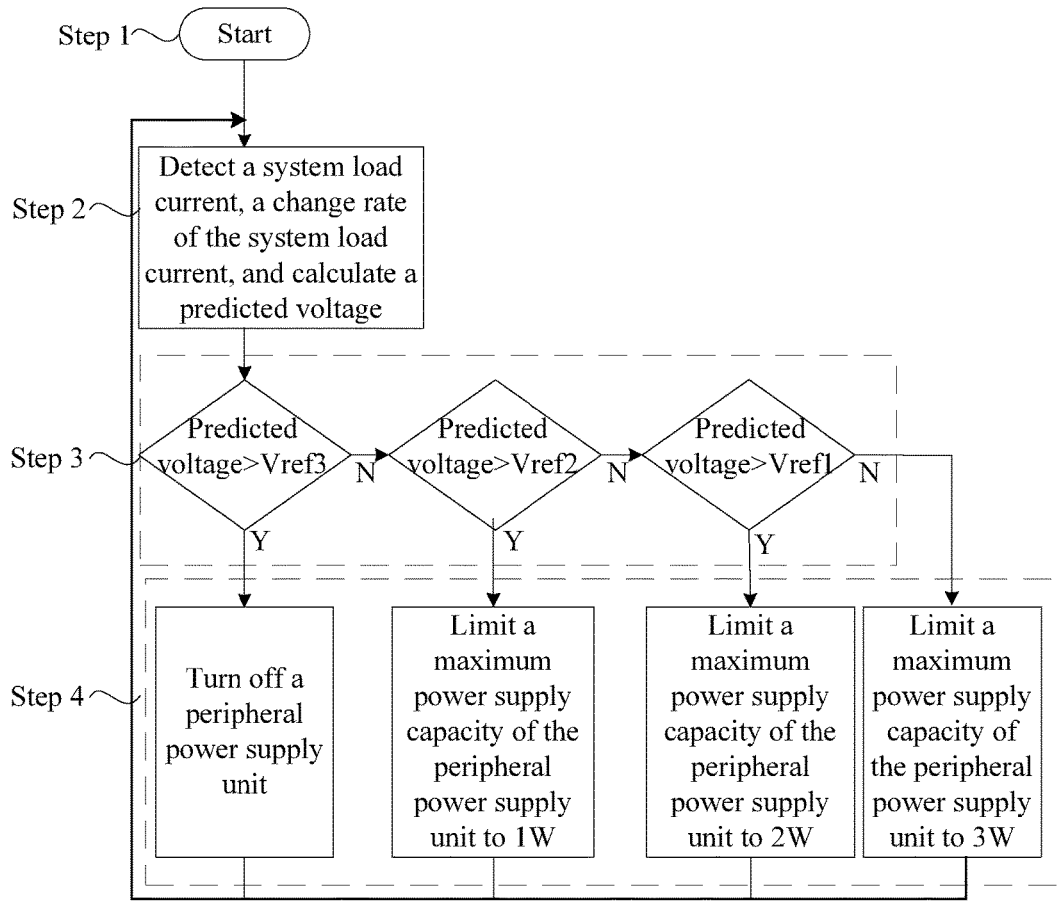
FIG. 7 is an operating flowchart of a power supply system according to an embodiment of the present invention.

According to an implementation manner of the present invention, it is assumed that total power consumption of power supply that may be provided by the power source unit of the power supply system is 6 W, and three reference voltages, which are Vref1, Vref2 and Vref3 separately, are set in the power supply system, where Vref1<Vref2<Vref3. As shown in FIG. 7, operating steps of the power supply system may be described as follows.

Step 1: The power supply system starts to supply power.

In this step, the power supply system is described using the structure of the power supply system illustrated in FIG. 2 as an example. The power supply system includes the power source unit, an electricity distribution unit, a system load power supply unit, and a peripheral power supply unit. The electricity distribution unit includes a power consumption prediction module and a power consumption control module. The power source unit provides total input power to supply power to system load and a peripheral. The electricity distribution unit distributes the total input power, transmits system load power to the system load power supply unit, and transmits peripheral power to the peripheral power supply unit.

It may be understood that in the embodiment, the structure of the power supply system described in FIG. 2 is merely used for description, but the power supply system in the embodiment is not limited to the power supply system shown in FIG. 2.

Step 2: The power supply system detects a system load current and a change rate of the system load current and calculates a predicted voltage.

In this step, the power consumption prediction module of the power supply system detects the system load current and the change rate of the system load current and calculates the predicted voltage. The system load current is used to reflect the system load power consumption, and the calculated predicted voltage is used to reflect a variation trend of the system load power consumption. In fact, the predicted voltage reflects a predicted current, and the predicted current reflects the variation trend of the system load power consumption. Therefore, the predicted voltage is calculated to reflect the variation trend of the system load power consumption.

Step 3: The power supply system compares the predicted voltage with the reference voltage.

In this step, the three reference voltages, which are Vref1, Vref2, and Vref3 separately, are set in the specific implementation manner. Therefore, a result of the comparison of the predicted voltage with the reference voltage has the following four possible situations: in a first possible situation, predicted voltage>Vref3; in a second possible situation, Vref3≥predicted voltage>Vref2; in a third possible situation, Vref2≥predicted voltage>Vref1; and in a fourth possible situation, predicted voltage≤Vref1. It is determined, by comparison, that the predicted voltage is in any possible situation described above.

It may be understood that the number of the reference voltages set in the embodiment and voltage values of the reference voltages are merely exemplary. In fact, any number of reference voltages and any voltage value of the reference voltage may be set for comparing and determining performed by the power supply system.

Step 4: The power supply system adjusts power supply capacities of the system load power supply unit and the peripheral power supply unit according to the result of the comparison.

In this step, when the predicted voltage is greater than the reference voltage, the power supply system increases the power supply capacity of the system load power supply unit and reduces the power supply capacity of the peripheral power supply unit; on the contrary, when the predicted voltage is not greater than the reference voltage, the power supply system reduces the power supply capacity of the system load power supply unit and increases the power supply capacity of the peripheral power supply unit. The foregoing four possible situations of the predicted voltage are corresponding to four control manners separately: in a first manner, the peripheral power supply unit is turned off; in a second manner, a maximum power supply capacity of the peripheral power supply unit is limited to 1 W; in a third manner, a maximum power supply capacity of the peripheral power supply unit is limited to 2 W; and in a fourth manner, a maximum power supply capacity of the peripheral power supply unit is limited to 3 W. In fact, total power supply capacity of the power supply system=the power supply capacity of the system load power supply unit+the power supply capacity of the peripheral power supply unit. Therefore, adjusting and limiting the power supply capacity of the peripheral power supply unit changes the power distribution manner of the power supply system, thereby resulting in more proper electricity distribution of the power supply system.

It may be understood that the foregoing description about the power supply capacities of the system load power supply unit and the peripheral power supply unit are merely used as an example, which is not described herein again.

In a power supply system provided by the embodiment of the present invention, system load power consumption is detected, a variation trend of the system load power consumption is calculated, and power supply capacities of a system load power supply unit and a peripheral power supply unit are adjusted according to the variation trend of the system load power consumption so as to enhance, with maximum efficiency, a power distribution capability of an electronic device.

Another aspect of the present invention provides an electronic device, including the power supply system described above. A structure and working principle of the power supply system are the same as those in the foregoing embodiment, which are not described herein again. In addition, for structures of other parts of the electronic device, refer to the prior art, which are not described in detail herein again.

For an electronic device provided by the embodiment of the present invention, the electronic device may be a product or component having a peripheral connected thereto, and the peripheral may be a computer, a television, a digital camera, a mobile phone, or the like, which is not limited in the present invention.

Figure 8:
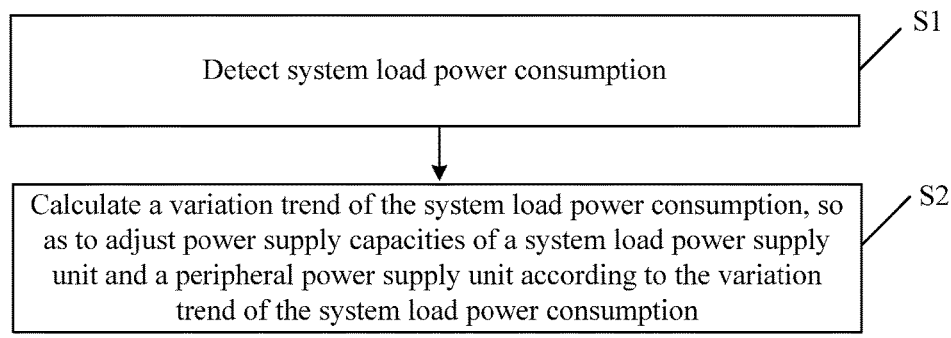
FIG. 8 is a flowchart of an electricity distribution method of an electronic device according to an embodiment of the present invention.

According to still another aspect of the present invention, an electricity distribution method of an electronic device is provided, and as shown in FIG. 8, includes the following steps.

S1: Detect system load power consumption.

S2: Calculate a variation trend of the system load power consumption so as to adjust power supply capacities of a system load power supply unit and a peripheral power supply unit according to the variation trend of the system load power consumption.

According to an implementation manner of the present invention, the electricity distribution method uses the electronic device described in the foregoing embodiments. As shown in FIG. 2, the electronic device includes a power supply system, where the power supply system includes the power source unit 1, the electricity distribution unit 2, the system load power supply unit 3, and the peripheral power supply unit 4. The electricity distribution unit 2 includes the power consumption prediction module 21 and the power consumption control module 22.

A structure and a principle of the electronic device are the same as those in the foregoing embodiments, which are not described herein again.

Further, calculating a variation trend of the system load power consumption includes detecting a system load current and a change rate of the system load current; generating a reference time; and calculating a predicted current according to the system load current, the change rate of the system load current and the reference time, where the predicted current is used to reflect the variation trend of the system load power consumption that is after the reference time.

Further, adjusting power supply capacities of a system load power supply unit and a peripheral power supply unit according to the variation trend of the system load power consumption includes setting a reference current; comparing the predicted current with the reference current; when the predicted current is greater than the reference current, increasing the power supply capacity of the system load power supply unit and reducing the power supply capacity of the peripheral power supply unit; and when the predicted current is not greater than the reference current, reducing the power supply capacity of the system load power supply unit and increasing the power supply capacity of the peripheral power supply unit.

In an electricity distribution method of an electronic device provided by the embodiment of the present invention, system load power consumption is detected, a variation trend of the system load power consumption is calculated, and power supply capacities of a system load power supply unit and a peripheral power supply unit are adjusted according to the variation trend of the system load power consumption so as to enhance, with maximum efficiency, a power distribution capability of an electronic device.

The embodiments in this specification are all described in a progressive manner. For same or similar parts in the embodiments, reference may be made to these embodiments, and each embodiment focuses on a difference from other embodiments. A method embodiment is basically similar to an apparatus embodiment, and therefore is described briefly. For related parts, reference may be made to partial descriptions in the apparatus embodiment.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A power supply system, comprising:
a power source unit;
an electricity distribution unit connected to the power source unit;
a system load power supply unit connected to the electricity distribution unit; and
a peripheral power supply unit connected to the electricity distribution unit, wherein the electricity distribution unit comprises:
a power consumption prediction module configured to:
detect a system load current and a current change rate of the system load current:
obtain a system load power consumption according to the system load current and the current change rate of the system load current that are detected;
identify a reference time unit;
calculate a predicted current after a passing of the reference time unit, according to a prediction formula, wherein the prediction formula is: predicted current=the system load current+(the current change rate*the reference time unit); and
determine a variation trend of the system load power consumption, according to the predicted current that is calculated; and
a power consumption control module configured to adjust power supply capacities of the system load power supply unit and the peripheral power supply unit according to the variation trend of the system load power consumption.

2. The power supply system according to claim 1, wherein the power consumption prediction module comprises:
a detection circuit configured to detect the system load current and the current change rate;
a time generation circuit configured to identify the reference time unit; and
a calculation circuit configured to calculate the predicted current; and
wherein the power consumption control module comprises:
a comparator circuit configured to:
set a reference current; and
compare the predicted current with the reference current; and
a control circuit configured to:
increase the power supply capacity of the system load power supply unit when the predicted current is greater than the reference current;
reduce the power supply capacity of the peripheral power supply unit when the predicted current is greater than the reference current;

reduce the power supply capacity of the system load power supply unit when the predicted current is not greater than the reference current; and increase the power supply capacity of the peripheral power supply unit when the predicted current is not greater than the reference current.

3. The power supply system according to claim 2, wherein the detection circuit comprises:
a first resistor connected between an input end and an output end of the system load power supply unit and configured to collect the system load current;
a first operational amplifier having a negative input end connected to the input end of the system load power supply unit through a second resistor, a positive input end connected to the output end of the system load power supply unit through a third resistor, and an output end delivering a first voltage reflecting the system load current;
a fourth resistor having one end connected to the negative input end of the first operational amplifier and the other end connected to the output end of the first operational amplifier;
a fifth resistor having one end connected to the positive input end of the first operational amplifier and the other end connected to a ground;
a second operational amplifier having a positive input end connected to the ground through a sixth resistor, a negative input end connected to the output end of the first operational amplifier through a first capacitor, and an output end delivering a second voltage reflecting the current change rate; and
a seventh resistor having one end connected to the negative input end of the second operational amplifier and the other end connected to the output end of the second operational amplifier.

4. The power supply system according to claim 3, wherein the time generation circuit comprises:
a third operational amplifier having a positive input end connected to the output end of the second operational amplifier through an eighth resistor, a negative input end connected to the ground through a ninth resistor, and an output end delivering a third voltage reflecting the reference time unit;
a tenth resistor having one end connected to the positive input end of the third operational amplifier and the other end connected to the ground; and
an eleventh resistor having one end connected to the negative input end of the third operational amplifier and the other end connected to the output end of the third operational amplifier.

5. The power supply system according to claim 4, wherein the calculation circuit comprises:
a fourth operational amplifier having:
a positive input end that is connected to the output end of the third operational amplifier through a twelfth resistor, is connected to the output end of the first operational amplifier through a thirteenth resistor, and is connected to the ground through a fourteenth resistor;
a negative input end connected to the ground through a fifteenth resistor; and
an output end delivering a fourth voltage reflecting the predicted current; and
a sixteenth resistor having one end connected to the negative input end of the fourth operational amplifier and the other end connected to the output end of the fourth operational amplifier.

6. The power supply system according to claim 5, wherein the comparator circuit comprises a comparator, wherein the comparator has a positive input end connected to the ground through a preset power source, a negative input end connected to the output end of the fourth operational amplifier, and an output end delivering a result of a comparison of a reference voltage with the fourth voltage, and wherein the preset power source is configured to provide the reference voltage reflecting the reference current.

7. The power supply system according to claim 5, wherein the fourth operational amplifier is further configured to calculate the fourth voltage according to a fourth voltage formula, wherein the fourth voltage formula is: the fourth voltage=k4*(the first voltage+the third voltage), and wherein k4 is a fourth amplification coefficient.

8. The power supply system according to claim 4, wherein the third operational amplifier is further configured to calculate the third voltage according to a third voltage formula, wherein the third voltage formula is: the third voltage=k3*the second voltage, and wherein k3 is third amplification coefficient that is equal to the reference time unit.

9. The power supply system according to claim 3, wherein the first operational amplifier is further configured to calculate the first voltage according to a first voltage formula, wherein the first voltage formula is: the first voltage=k1*the system load current, and wherein k1 is a first amplification coefficient.

10. The power supply system according to claim 3, wherein the second operational amplifier is further configured to calculate the second voltage according to a second voltage formula, wherein the second voltage formula is: the second voltage=k2*the current change rate, and wherein k2 is a second amplification coefficient.

11. An electricity distribution method of an electronic device, comprising:
detecting a system load current and a current change rate of the system load current;
obtaining a system load power consumption, according to the system load current and the current change rate of the system load current that are detected;
identifying a reference time unit;
calculating a predicted current according to the system load current, the change rate of the system load current and the reference time unit, wherein the predicted current is calculated by adding the system load current to a product of the current change rate and the reference time unit;
according to the predicted current that is calculated, determining a variation trend of the system load power consumption; and
adjusting power supply capacities of a system load power supply unit and a peripheral power supply unit according to the variation trend of the system load power consumption.

12. The electricity distribution method according to claim 11, wherein adjusting power supply capacities of the system load power supply unit and the peripheral power supply unit according to the variation trend of the system load power consumption comprises:
setting a reference current;
comparing the predicted current with the reference current;
increasing the power supply capacity of the system load power supply unit when the predicted current is greater than the reference current;

reducing the power supply capacity of the peripheral power supply unit when the predicted current is greater than the reference current; and reducing the power supply capacity of the system load power supply unit when the predicted current is not greater than the reference current; and increasing the power supply capacity of the peripheral power supply unit when the predicted current is not greater than the reference current.

13. The electricity distribution method according to claim 11, further comprising:

calculating a first voltage according to a first voltage formula, wherein the first voltage formula is: the first voltage=k1*the system load current, and wherein k1 is a first amplification coefficient; and calculating a second voltage according to a second voltage formula, wherein the second voltage formula is: the second voltage=k2*the current change rate, and wherein k2 is second amplification coefficient.

14. The electricity distribution method according to claim 13, wherein the method further comprising: calculating a third voltage according to a third voltage formula, wherein the third voltage formula is: the third voltage=k3*the second voltage, and wherein k3 is a third amplification coefficient that is equal to the reference time unit.

15. The electricity distribution method according to claim 14, further comprising:

calculating a fourth voltage according to a fourth voltage formula, wherein the fourth voltage formula is: the fourth voltage=k4*(the first voltage+the third voltage), and wherein k4 is a fourth amplification coefficient.

16. A power supply system, comprising:

a processor; and a non-transitory computer-readable storage medium coupled to the processor and storing programming instructions for execution by the processor, wherein the programming instructions instruct the processor to:

detect a system load current and a current change rate of the system load current;

obtain a system load power consumption according to the system load current and the current change rate of the system load current that are detected;

identify a reference time unit;

calculate a predicted current after a passing of the reference time unit, according to a prediction formula, wherein the prediction formula is: predicted current=the system load current+(the current change rate*the reference time unit);

determine a variation trend of the system load power consumption, according to the predicted current that is calculated; and adjust power supply capacities of a system load power supply unit and a peripheral power supply unit according to the variation trend of the system load power consumption.

17. The power supply system according to claim 16, wherein the programming instructions further instruct the processor to:

set a reference current; and compare the predicted current with the reference current;

increase the power supply capacity of the system load power supply unit when the predicted current is greater than the reference current;

reduce the power supply capacity of the peripheral power supply unit when the predicted current is greater than the reference current;

reduce the power supply capacity of the system load power supply unit when the predicted current is not greater than the reference current; and increase the power supply capacity of the peripheral power supply unit when the predicted current is not greater than the reference current.

18. The power supply system according to claim 16, wherein the programming instructions further instruct the processor to:

calculate a first voltage according to a first voltage formula, wherein the first voltage formula is: the first voltage=k1*the system load current, and wherein k1 is first amplification coefficient; and calculate a second voltage according to a second voltage formula, wherein the second voltage formula is: the second voltage=k2*the current change rate, and wherein k2 is second amplification coefficient.

19. The power supply system according to claim 18, wherein the programming instructions further instruct the processor to:

calculate a third voltage according to a third voltage formula, wherein the third voltage formula is: the third voltage=k3*the second voltage, and wherein k3 is third amplification coefficient that is equal to the reference time unit.

20. The power supply system according to claim 19, wherein the programming instructions further instruct the processor to:

calculate a fourth voltage according to a fourth voltage formula, wherein the fourth voltage formula is: the fourth voltage=k4*(the first voltage+the third voltage), k4 is fourth amplification coefficient.

* * * * *